US012804919B2

(12) United States Patent
Wu et al.

(10) Patent No.: US 12,804,919 B2
(45) Date of Patent: Nov. 17, 2026

(54) 3D CAPACITANCE STRUCTURE WITH ELECTRODE EXTENDED PORTIONS AND MANUFACTURE METHOD THEREOF

(71) Applicant: Winbond Electronics Corp., Taichung City (TW)

(72) Inventors: Jin-Neng Wu, Kaohsiung City (TW); Shih-Han Hung, Tainan City (TW)

(73) Assignee: Winbond Electronics Corp., Taichung City (TW)

( * ) Notice: Subject to any disclaimer, the term of this patent is extended or adjusted under 35 U.S.C. 154(b) by 350 days.

(21) Appl. No.: 18/621,039

(22) Filed: Mar. 28, 2024

(65) Prior Publication Data

US 2025/0287621 A1 Sep. 11, 2025

(30) Foreign Application Priority Data

Mar. 11, 2024 (TW) ................................ 113108848

(51) Int. Cl.
*H10D 1/68* (2025.01)
*H10D 84/00* (2025.01)
(Continued)

(52) U.S. Cl.
CPC ........... *H10D 1/716* (2025.01); *H10D 84/212* (2025.01); *H10D 88/00* (2025.01); *H10W 44/601* (2026.01)

(58) Field of Classification Search
CPC ...... H10D 1/716; H10D 84/212; H10D 88/00; H10W 44/601
(Continued)

(56) References Cited

U.S. PATENT DOCUMENTS 5,583,359 A * 12/1996 Ng ..................... H10W 20/496 257/532
7,548,432 B2 6/2009 Lu et al.
(Continued)

FOREIGN PATENT DOCUMENTS

| | | |
|---|---|---|
| JP | 2013254847 | 12/2013 |
| JP | 2013254848 | 12/2013 |
| KR | 20130027404 | 3/2013 |

OTHER PUBLICATIONS

"Office Action of Japan counterpart Application", issued on Nov. 11, 2025, p. 1-p. 3.

(Continued)

*Primary Examiner* — Eric W Jones
(74) *Attorney, Agent, or Firm* — JCIPRNET

(57) ABSTRACT

A 3D capacitance structure, including multiple sub-capacitance stack structures, multiple first electrode contacts, and multiple second electrode contacts, is provided. Each sub-capacitance stack structure includes a dielectric stack, a lower electrode structure, and an upper electrode structure. The dielectric stack includes a stack of dielectric layers and etching stop layers. The lower electrode structure includes a lower electrode plate disposed in a lower dielectric layer and multiple lower electrode extended portions passing upward from the lower electrode plate through a lower etching stop layer to an intermediate dielectric layer. The upper electrode structure includes an upper electrode plate disposed in an upper dielectric layer and multiple upper electrode extended portions extending downward from the upper electrode plate to the lower etching stop layer. The first electrode contacts and the second electrode contacts are respectively connected to lower and upper electrode plates of two adjacent layers in the sub-capacitance stack structures.

12 Claims, 20 Drawing Sheets

(51) Int. Cl.
*H10D 88/00* (2026.01)
*H10W 44/00* (2026.01)

(58) Field of Classification Search
USPC .......................................................... 257/532
See application file for complete search history.

(56) References Cited

U.S. PATENT DOCUMENTS

| | | | | |
|---|---|---|---|---|
| 8,759,893 | B2 | 6/2014 | Cho | |
| 9,331,013 | B2 | 5/2016 | Yen et al. | |
| 9,685,433 | B2 | 6/2017 | Li | |
| 9,761,655 | B1 * | 9/2017 | Ando | H10D 1/696 |
| 9,984,823 | B2 * | 5/2018 | Lim | H01G 4/06 |
| 10,692,967 | B1 | 6/2020 | Chen et al. | |
| 11,538,748 | B2 | 12/2022 | Duan et al. | |
| 2003/0234415 | A1 | 12/2003 | Chien | |
| 2011/0075317 | A1 * | 3/2011 | Oikawa | H01G 4/33 29/25.03 |
| 2013/0056853 | A1 | 3/2013 | Cho | |
| 2013/0270675 | A1 * | 10/2013 | Childs | H10W 20/42 257/532 |
| 2013/0329337 | A1 | 12/2013 | Masuda et al. | |
| 2013/0329339 | A1 * | 12/2013 | Masuda | H01G 9/048 361/311 |
| 2014/0367827 | A1 | 12/2014 | Lee et al. | |
| 2016/0133690 | A1 * | 5/2016 | West | H10D 1/68 257/534 |
| 2020/0044013 | A1 | 2/2020 | Lu et al. | |
| 2023/0343818 | A1 * | 10/2023 | Tsai | H10D 1/042 |

OTHER PUBLICATIONS

"Office Action of Korea Counterpart Application", issued on Jun. 10, 2025, p. 1-p. 6.

* cited by examiner

3D CAPACITANCE STRUCTURE WITH ELECTRODE EXTENDED PORTIONS AND MANUFACTURE METHOD THEREOF

CROSS-REFERENCE TO RELATED APPLICATION

This application claims the priority benefit of Taiwan application serial no. 113108848, filed on Mar. 11, 2024. The entirety of the above-mentioned patent application is hereby incorporated by reference herein and made a part of this specification.

BACKGROUND

Technical Field

The disclosure relates to a capacitance structure, and in particular to a 3D capacitance structure and a manufacturing method thereof.

Description of Related Art

Due to the technical bottlenecks caused by the continuous miniaturization of chips, the industry has shifted from improving the manufacturing process to increase the number of transistors in a single silicon wafer area to improving overall performance through complex system-level chip design with relatively controllable costs. “Chiplet” has received much attention to implement higher transistor density and performance at a relatively low cost.

The chiplet is to split many elements originally included in a single chip into multiple small units, and then individually strengthen the function, redesign, and remanufacture to form a system chip through advanced packaging technology.

However, a single capacitor in the chiplet is limited to being manufactured on a silicon substrate, but cannot be made into a capacitor that is too high in capacitance, so the capacitance is also limited and cannot be increased.

SUMMARY

A 3D capacitance structure of the disclosure includes a substrate, multiple sub-capacitance stack structures, multiple first electrode contacts, and multiple second electrode contacts. The sub-capacitance stack structures are disposed on the substrate. Each sub-capacitance stack structure includes a dielectric stack, a lower electrode structure, and an upper electrode structure. The dielectric stack includes a stack of a lower dielectric layer, a lower etching stop layer, an intermediate dielectric layer, an upper etching stop layer, and an upper dielectric layer. The lower electrode structure includes a lower electrode plate disposed in the lower dielectric layer and multiple lower electrode extended portions passing upward from the lower electrode plate through the lower etching stop layer to the intermediate dielectric layer. The upper electrode structure includes an upper electrode plate disposed in the upper dielectric layer and multiple upper electrode extended portions passing downward from the upper electrode plate through the upper etching stop layer and the intermediate dielectric layer to the lower etching stop layer. The first electrode contacts respectively connect the lower electrode plates of two adjacent layers in the sub-capacitance stack structures. The second electrode contacts respectively connect the upper electrode plates of two adjacent layers in the sub-capacitance stack structures.

A manufacturing method of a 3D capacitance structure of the disclosure includes the steps of (a) forming a first lower electrode plate on a substrate; (b) forming a first dielectric stack on the first lower electrode plate, wherein the first dielectric stack includes a stack of a lower dielectric layer, an etching stop layer, and an upper dielectric layer; (c) forming multiple first lower electrode extended portions in the first dielectric stack, wherein the first lower electrode extended portions pass upward from the first lower electrode plate through the etching stop layer to the upper dielectric layer; (d) forming a second dielectric stack, wherein a structure of the second dielectric stack is the same as the first dielectric stack; (e) forming multiple first upper electrode extended portions in the second dielectric stack, wherein the first upper electrode extended portions pass through an etching stop layer of the second dielectric stack to extend to the etching stop layer of the first dielectric stack; (f) forming a first upper electrode plate in the upper dielectric layer of the second dielectric stack, wherein the first upper electrode plate is connected to the first upper electrode extended portions; (g) forming a third dielectric stack, wherein a structure of the third dielectric stack is the same as the first dielectric stack; (h) forming a first contact opening passing through the third dielectric stack, the second dielectric stack, and the first dielectric stack until the first lower electrode plate is exposed; (i) forming a lower electrode plate trench in an upper dielectric layer of the third dielectric stack, wherein the lower electrode plate trench and the first contact opening form a first dual damascene opening; (j) forming a conductor material in the first dual damascene opening to simultaneously form a first electrode contact and a second lower electrode plate; (k) repeating (b) to (d) to form a fourth dielectric stack, multiple second lower electrode extended portions, and a fifth dielectric stack; (l) forming a second contact opening passing through the fifth dielectric stack, the fourth dielectric stack, and the third dielectric stack until the first upper electrode plate is exposed; (m) forming multiple extended portion openings passing through the fifth dielectric stack and an upper dielectric layer of the fourth dielectric stack until an etching stop layer of the fourth dielectric stack is exposed; (n) forming an upper electrode plate trench in an upper dielectric layer of the fifth dielectric stack, wherein the upper electrode plate trench, the extended portion openings, and the second contact opening form a second dual damascene opening; (o) forming a conductor material in the second dual damascene opening to simultaneously form a second electrode contact, multiple second upper electrode extended portions, and a second upper electrode plate; and (p) repeating (g) to (o) at least once.

In order for the features and advantages of the disclosure to be more comprehensible, the following specific embodiments are described in detail in conjunction with the drawings.

DESCRIPTION OF THE EMBODIMENTS

Figure 1:
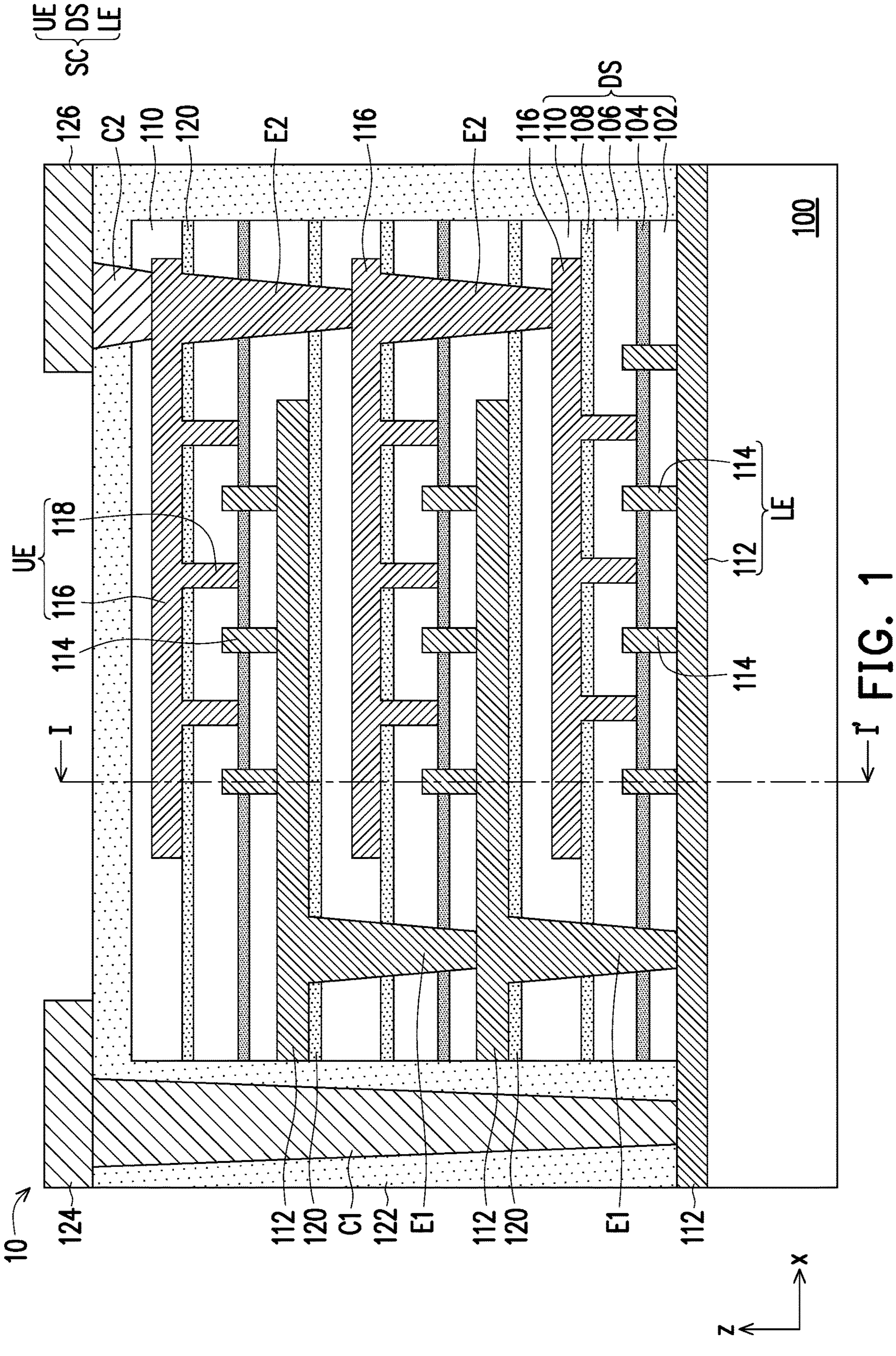
FIG. 1 is a schematic cross-sectional view of a 3D capacitance structure according to a first embodiment of the disclosure.

FIG. 1 is a schematic cross-sectional view of a 3D capacitance structure 10 according to a first embodiment of the disclosure. Please refer to FIG. 1. The 3D capacitance structure 10 of the embodiment includes a substrate 100, multiple sub-capacitance stack structures SC, multiple first electrode contacts E1, and multiple second electrode contacts E2. The sub-capacitance stack structure SC is disposed on the substrate 100, wherein each sub-capacitance stack structure SC includes a dielectric stack DS, a lower electrode structure LE, and an upper electrode structure UE. The dielectric stack DS includes a stack of a lower dielectric layer 102, a lower etching stop layer 104, an intermediate dielectric layer 106, an upper etching stop layer 108, and an upper dielectric layer 110. In an embodiment, the lower dielectric layer 102, the intermediate dielectric layer 106, and the upper dielectric layer 110 include silicon oxide, and the lower etching stop layer 104 and the upper etching stop layer 108 include silicon nitride. However, the disclosure is not limited thereto. The lower electrode structure LE includes a lower electrode plate 112 disposed in the lower dielectric layer 102 and multiple lower electrode extended portions 114 passing upward from the lower electrode plate 112 through the lower etching stop layer 104 to the intermediate dielectric layer 106. The upper electrode structure UE includes an upper electrode plate 116 disposed in the upper dielectric layer 110 and multiple upper electrode extended portions 118 passing downward from the upper electrode plate 116 through the upper etching stop layer 108 and the intermediate dielectric layer 106 to the lower etching stop layer 104. In other words, the 3D capacitance structure 10 has three sub-capacitance stack structures SC. However, the disclosure is not limited thereto. In another embodiment, the number of stacks of the sub-capacitance stack structures SC may be higher.

In FIG. 1, the extending directions of the lower electrode extended portion 114 and the upper electrode extended portion 118 are perpendicular to the surface direction of the substrate 100. The surface directions of the lower electrode plate 112 and the upper electrode plate 116 are perpendicular to the extending directions of the first electrode contact E1 and the second electrode contact E2.

Please continue to refer to FIG. 1. The first electrode contacts E1 respectively connect the lower electrode plates 112 of two adjacent layers in the sub-capacitance stack structures SC, wherein each first electrode contact E1 directly contacts the lower electrode plate 112 of the adjacent upper layer and the lower electrode plate 112 of the adjacent lower layer. The second electrode contacts E2 respectively connect the upper electrode plates 116 of two adjacent layers in the sub-capacitance stack structures SC, wherein each second electrode contact E2 directly contacts the upper electrode plate 116 of the adjacent upper layer and the upper electrode plate 116 of the adjacent lower layer. Since the heights of the first electrode contact E1 and the second electrode contact E2 connecting the upper and lower sub-capacitance stack structures SC are fixed at approximately one dielectric stack DS, the stacked 3D capacitance structure 10 can be formed without other connection structures. In addition, the upper etching stop layer 108 and the lower etching stop layer 104 in the dielectric stack DS are conducive to controlling the thickness of each layer. For example, the size (for example, the height) of the upper electrode extended portion 118 may be controlled through the lower etching stop layer 104, so the most suitable stack can be obtained. In addition, another etching stop layer 120 may be added between the upper and lower sub-capacitance stack structures SC as a stop layer during a process of forming the lower electrode plate 112.

In order to connect circuits of the 3D capacitance structure 10 to external or other elements, an interconnection structure may be formed on the substrate 100. For example, the interconnection structure has an insulation layer 122 covering the entire 3D capacitance structure 10, a first contact window C1 connected to the lower electrode plate 112, a second contact window C2 connected to the upper electrode plate 116, a first metal layer 124 located on the insulation layer 122 and connected to the first contact window C1, and a second metal layer 126 located on the insulation layer 122 and connected to the second contact window C2. However, the disclosure is not limited thereto. In another embodiment, the interconnection structure may include multiple first contact windows C1 and multiple second contact windows C2, and the arrangement positions thereof may be changed according to requirements.

Figure 2:
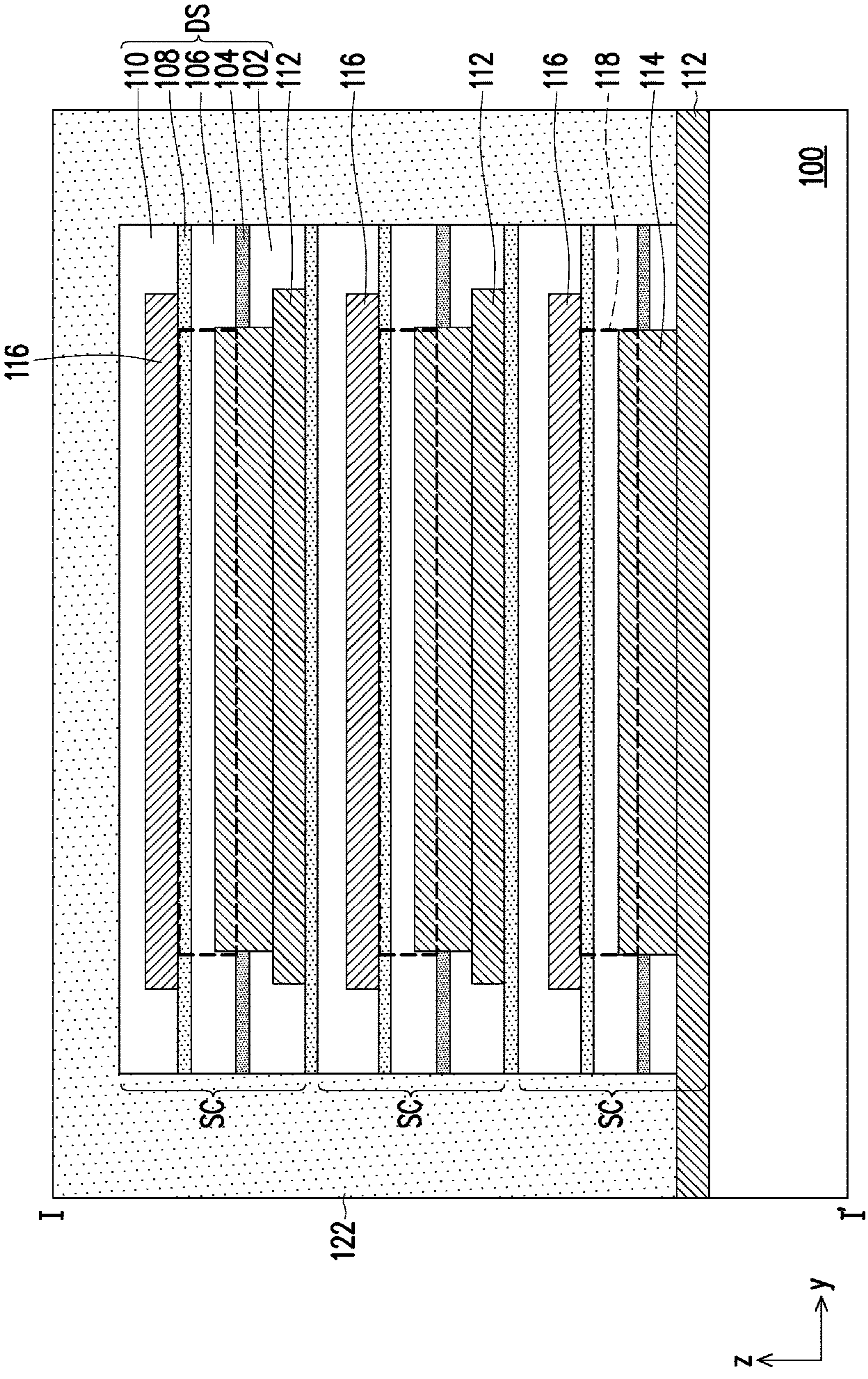
FIG. 2 is a schematic cross-sectional view of a 3D capacitance structure along a line I-I' of FIG. 1.

FIG. 2 is a schematic cross-sectional view of the 3D capacitance structure 10 along a line I-I' of FIG. 1. FIG. 1 shows a cross-section of the x-z plane, and FIG. 2 shows a cross-section of the y-z plane, so FIG. 2 only shows the dielectric stack DS, the upper electrode plate 116, the lower electrode plate 112, and the lower electrode extended portion 114 in the sub-capacitance stack structure SC, and a dotted line portion is the position of the upper electrode extended portion 118. Therefore, the lower electrode extended portion 114 and the upper electrode extended portion 118 of the first embodiment may be strip structures staggered along the x direction. However, the disclosure is not limited thereto.

Figure 3:
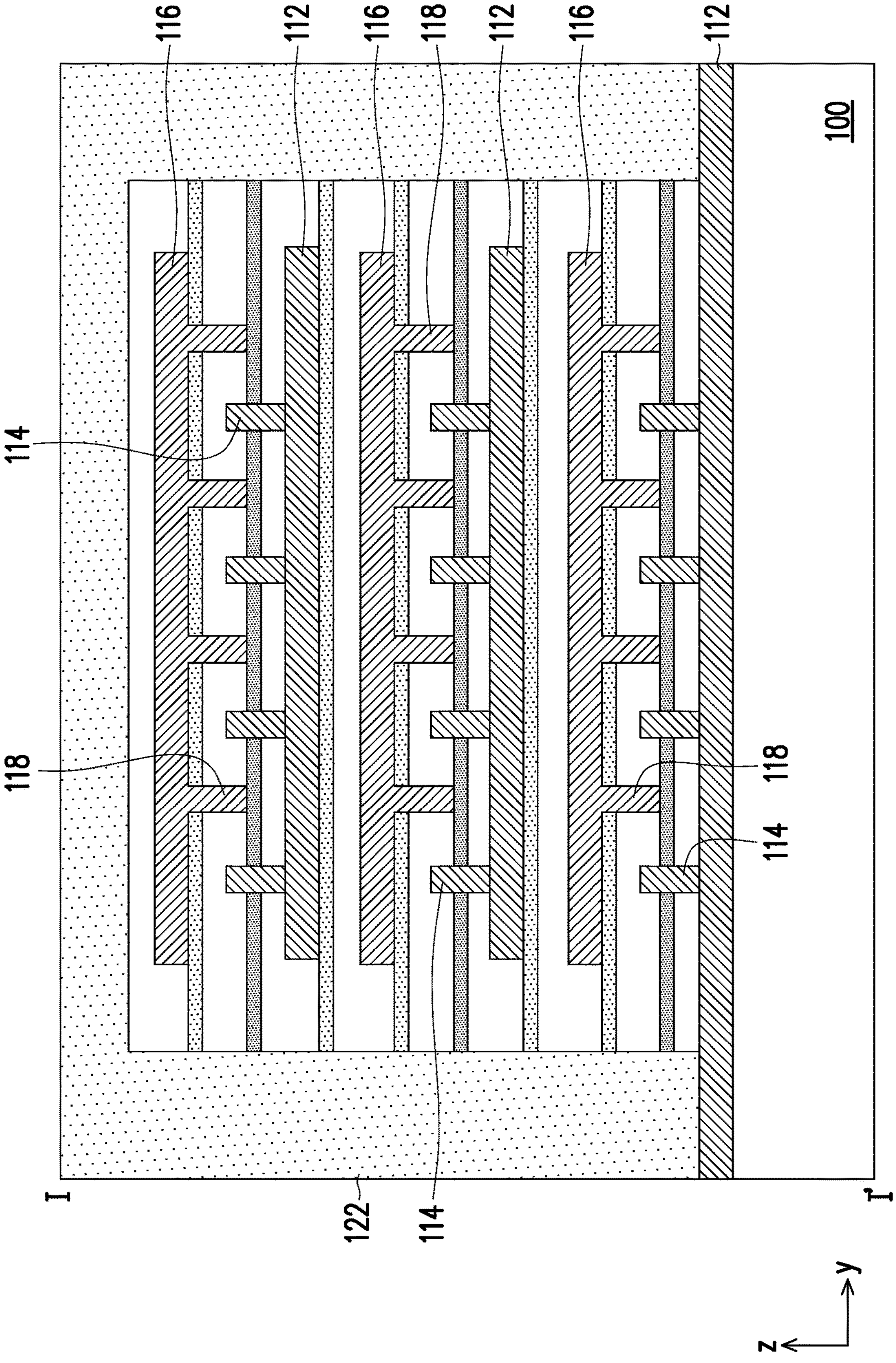
FIG. 3 is a schematic cross-sectional view of another 3D capacitance structure along a line I-I' of FIG. 1.

FIG. 3 is a schematic cross-sectional view of another 3D capacitance structure 10 along a line I-I' of FIG. 1. FIG. 3 also shows a cross-section of the y-z plane and shows that the lower electrode extended portion 114 and the upper electrode extended portion 118 are columnar structures staggered along the x direction and the y direction. Since an area between the lower electrode extended portion 114 and the upper electrode extended portion 118 of FIG. 3 is greater than the structure of FIG. 2, FIG. 3 should have a greater capacitance than FIG. 2 in the case where other structures are all the same.

Figure 4:
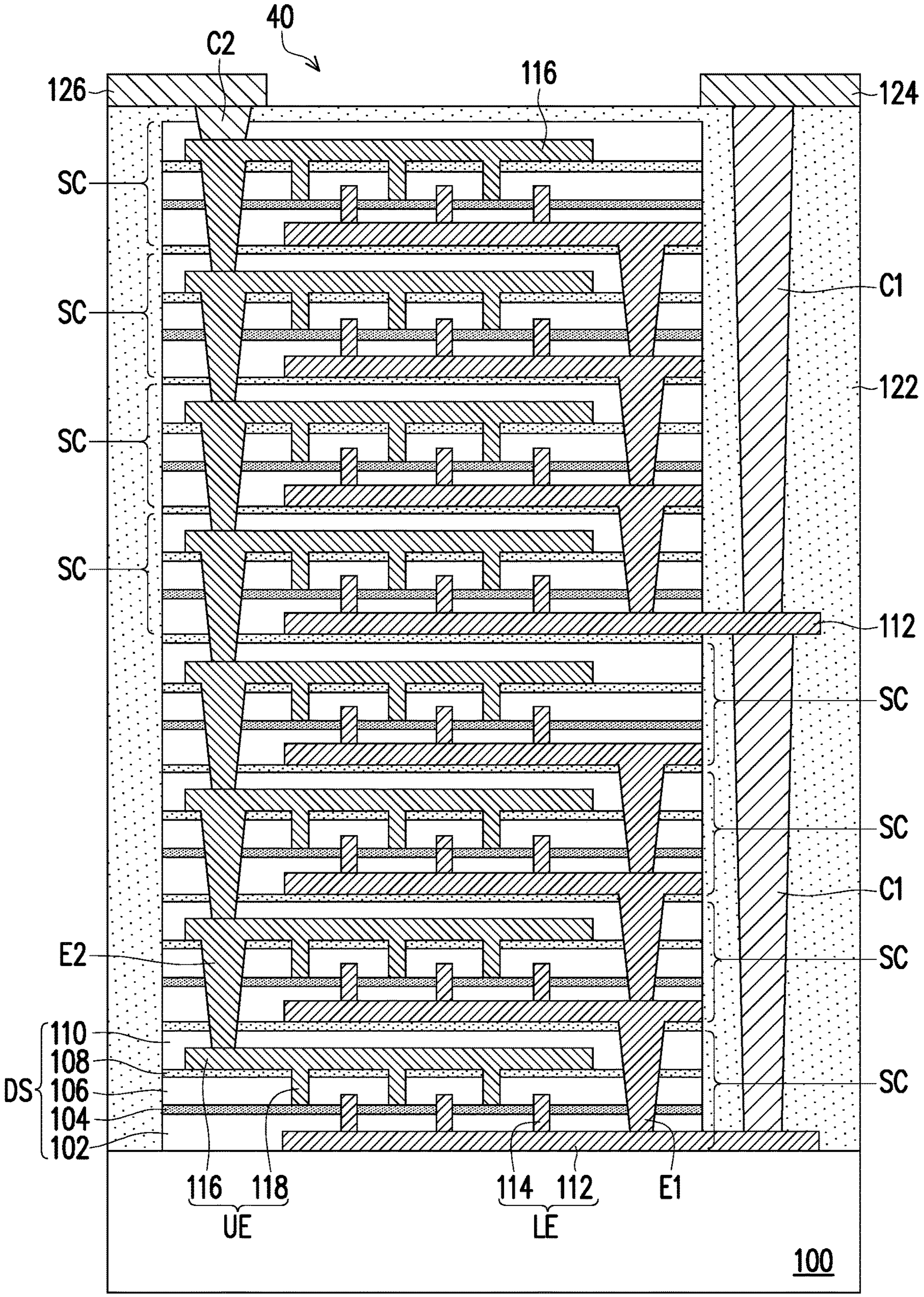
FIG. 4 is a schematic cross-sectional view of a 3D capacitance structure according to a second embodiment of the disclosure.

FIG. 4 is a schematic cross-sectional view of a 3D capacitance structure 40 according to a second embodiment of the disclosure, wherein the same reference numerals as those in the first embodiment are used to represent the same or similar parts and components, and for the relevant contents of the same or similar parts and components, reference may also be made to the contents of the first embodiment, which will not be described again.

Please refer to FIG. 4. The 3D capacitance structure 40 of the second embodiment is basically the same as the 3D capacitance structure 10 of the first embodiment. The difference is that the 3D capacitance structure 40 has a total of eight sub-capacitance stack structures SC. In order to ensure that the structure of the first contact window C1 is stable and does not collapse, the eight sub-capacitance stack structures SC may be divided into two groups, one first contact window C1 is provided for every 4 lower electrode plates 112, and the first metal layer 124 is connected by connecting the first contact windows C1 in series. Since the sizes of the second electrode contact E2 and the second contact window C2 between the upper electrode plates 116 are smaller (lower), the original designs may be maintained. However, the disclosure is not limited thereto. In another embodiment, the connection design between the upper electrode plates 116 may be swapped with the connection design between the lower electrode plates 112.

Figure 5A:
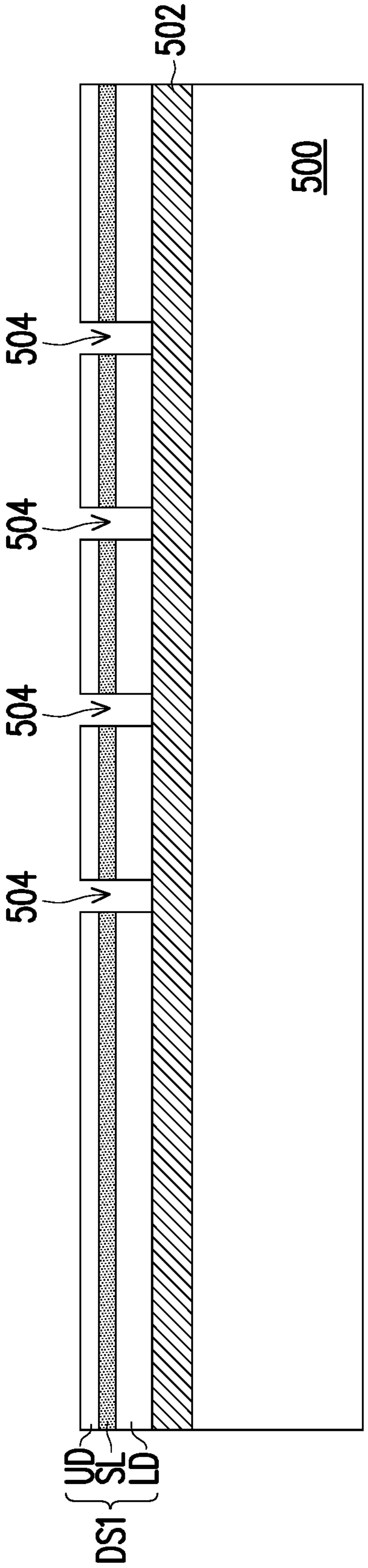
FIG. 5A to FIG. 5S are schematic cross-sectional views of a manufacturing process of a 3D capacitance structure according to a third embodiment of the disclosure.
Figure 5B:
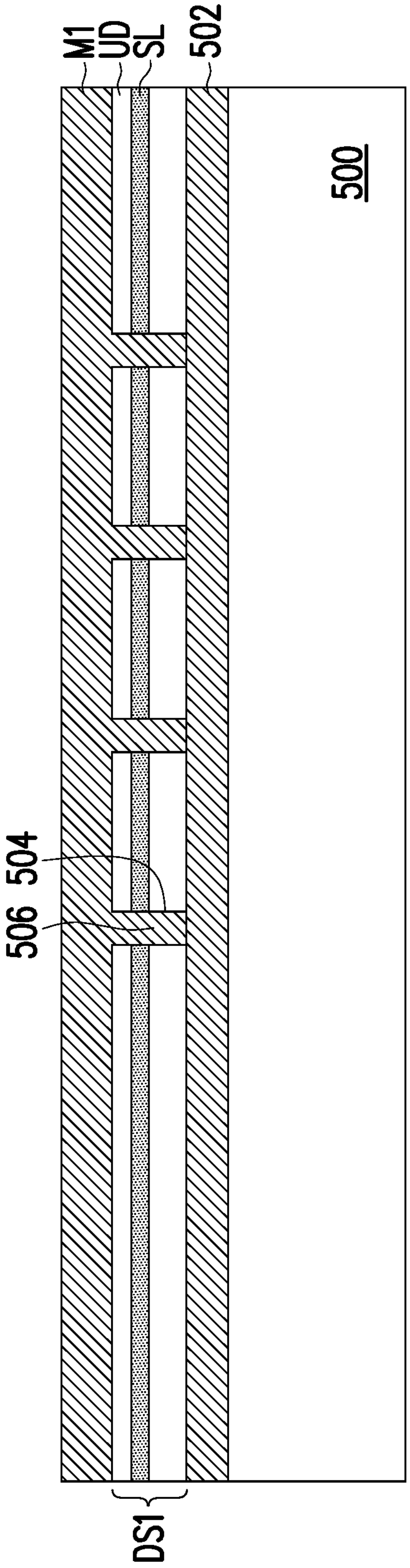
Figure 5C:
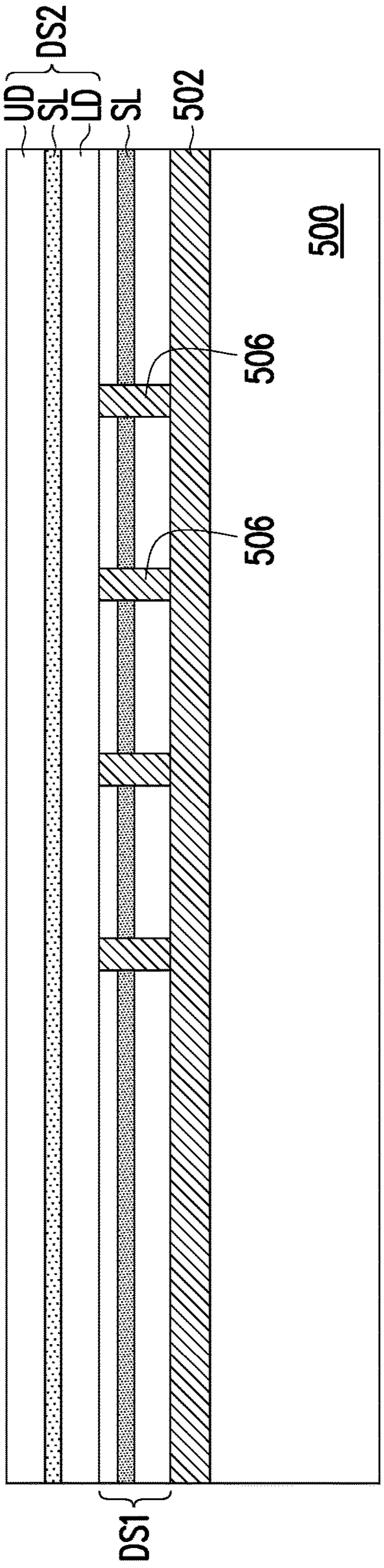
Figure 5D:
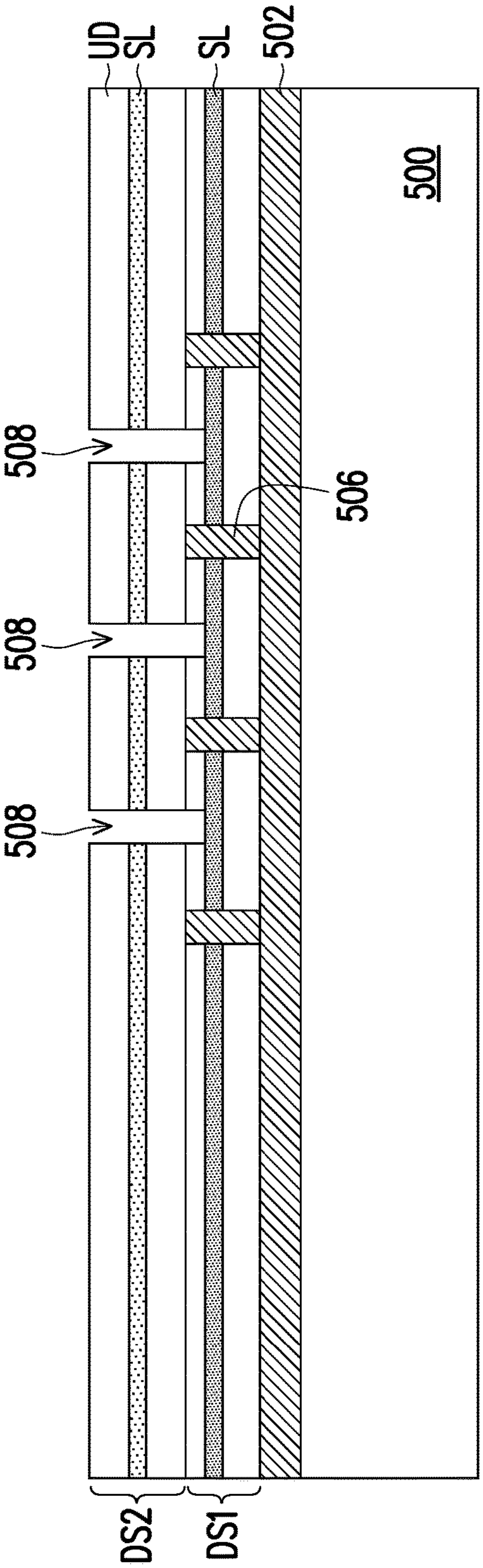
Figure 5E:
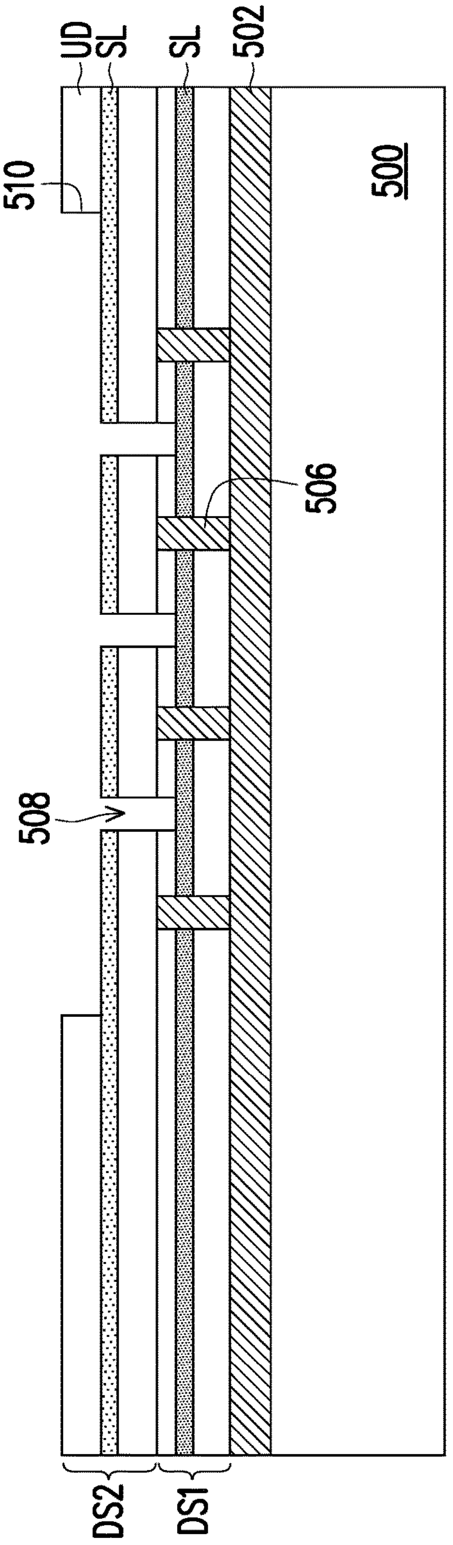
Figure 5F:
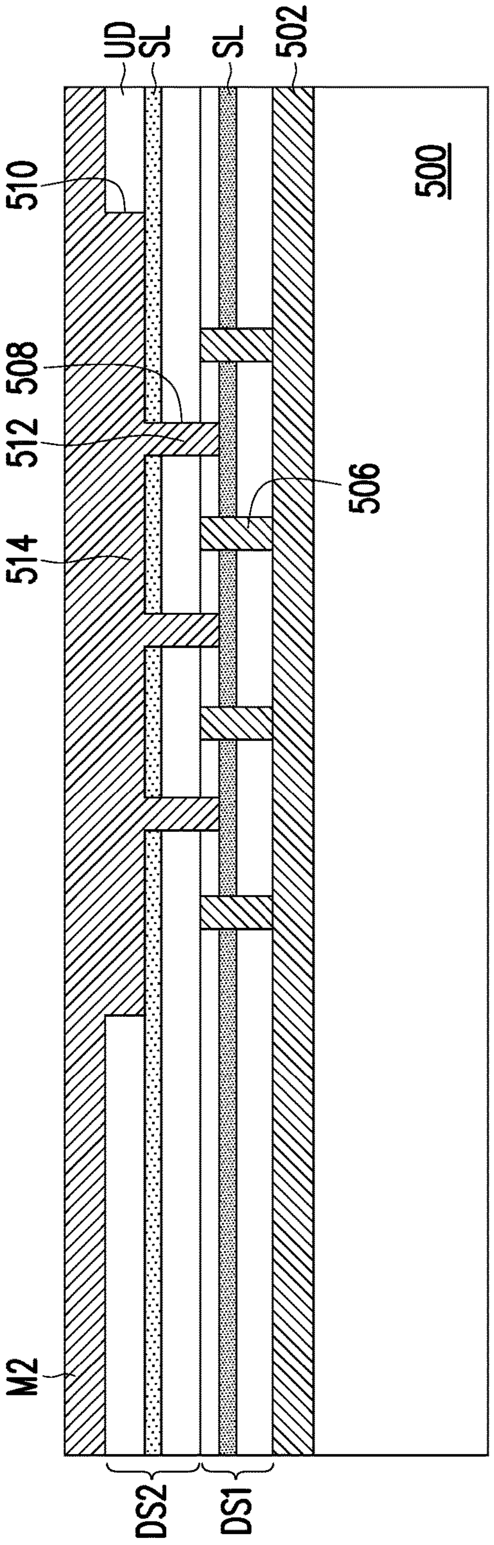
Figure 5G:
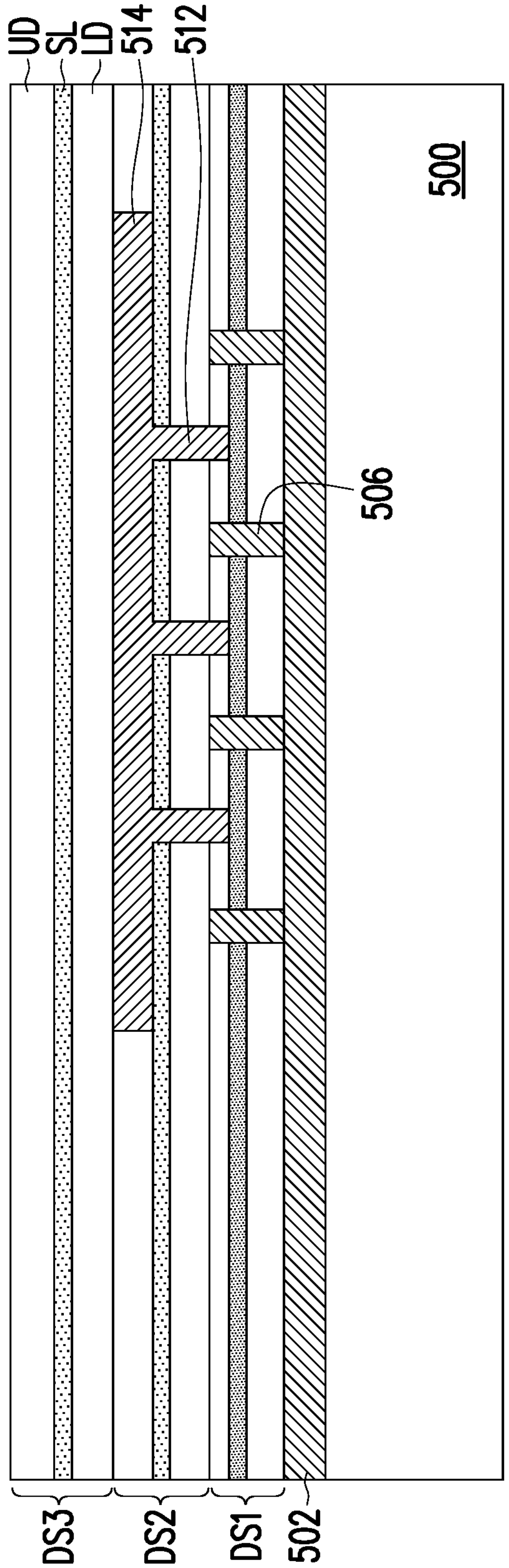
Figure 5H:
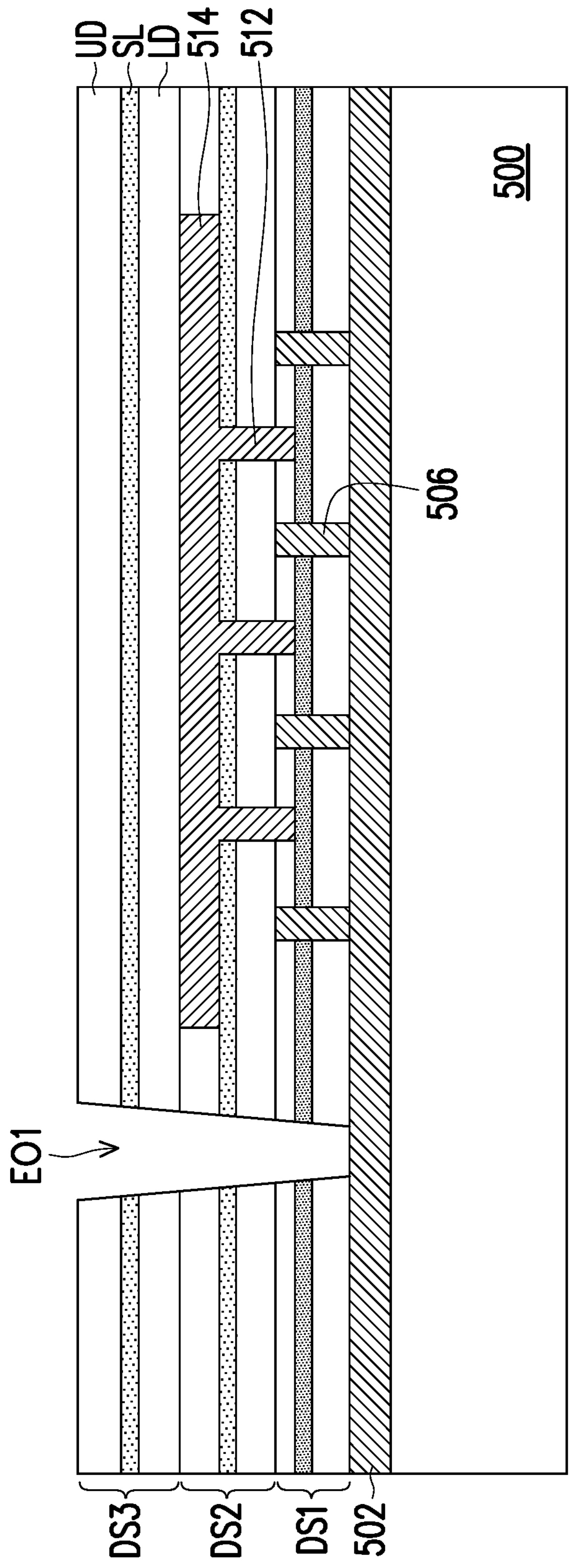
Figure 5I:
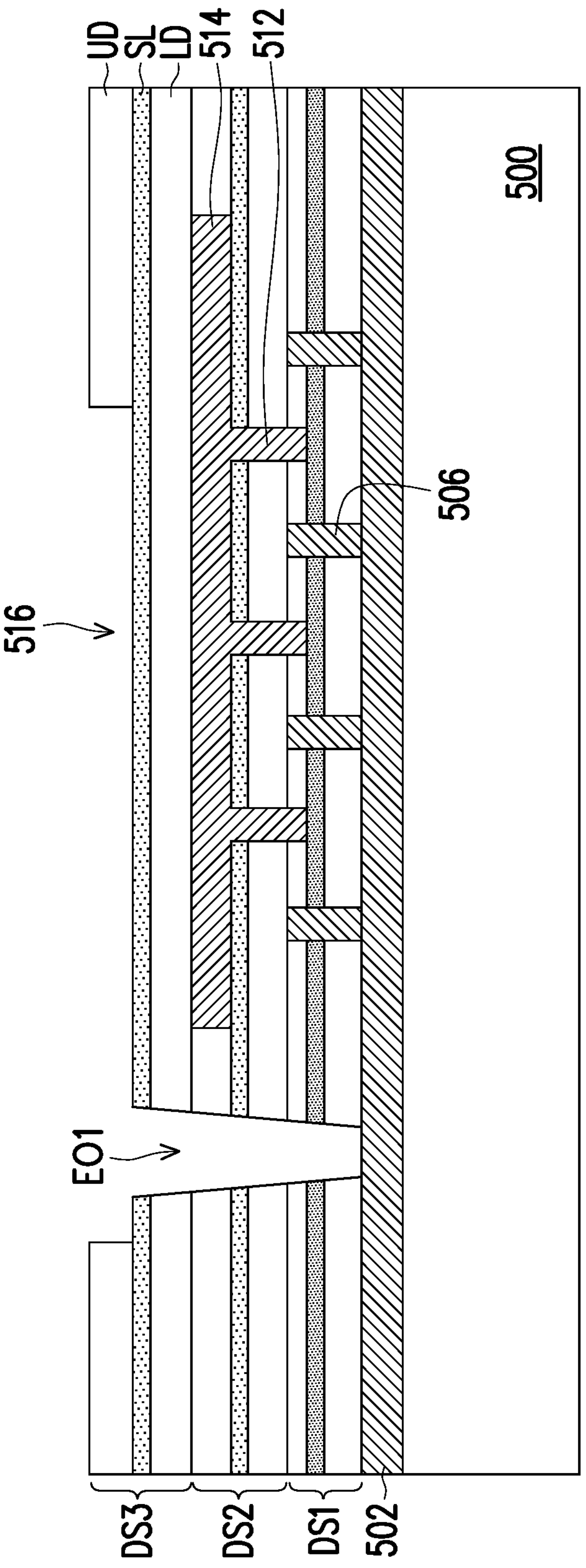
Figure 5J:
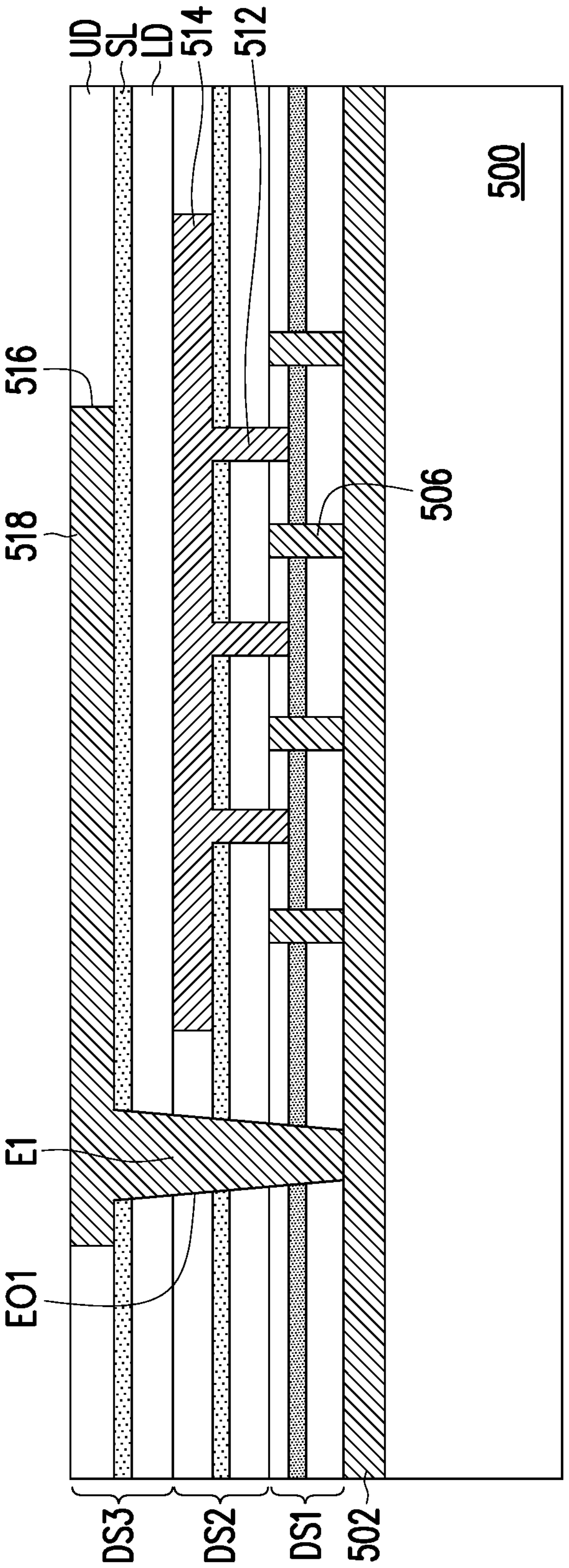
Figure 5K:
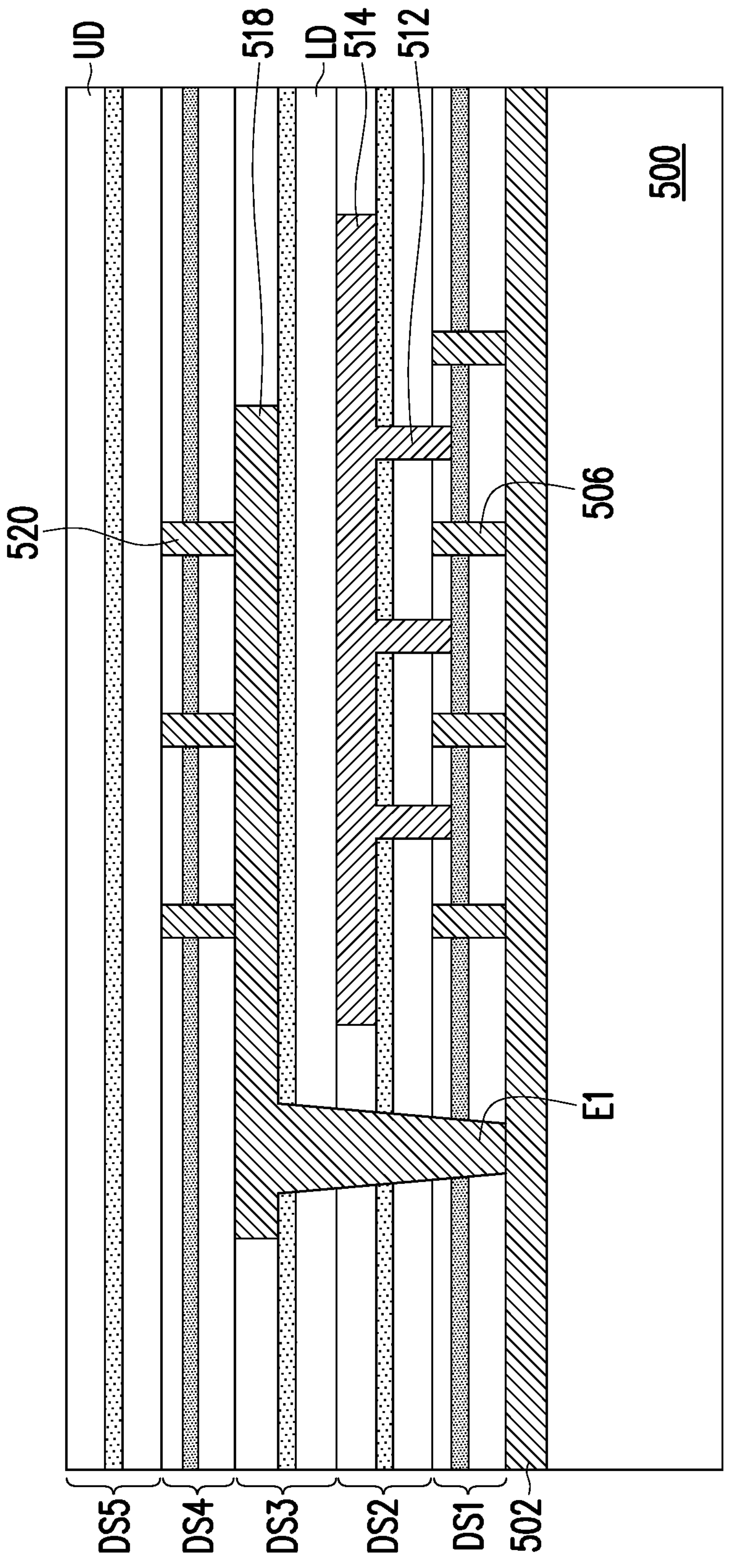
Figure 5L:
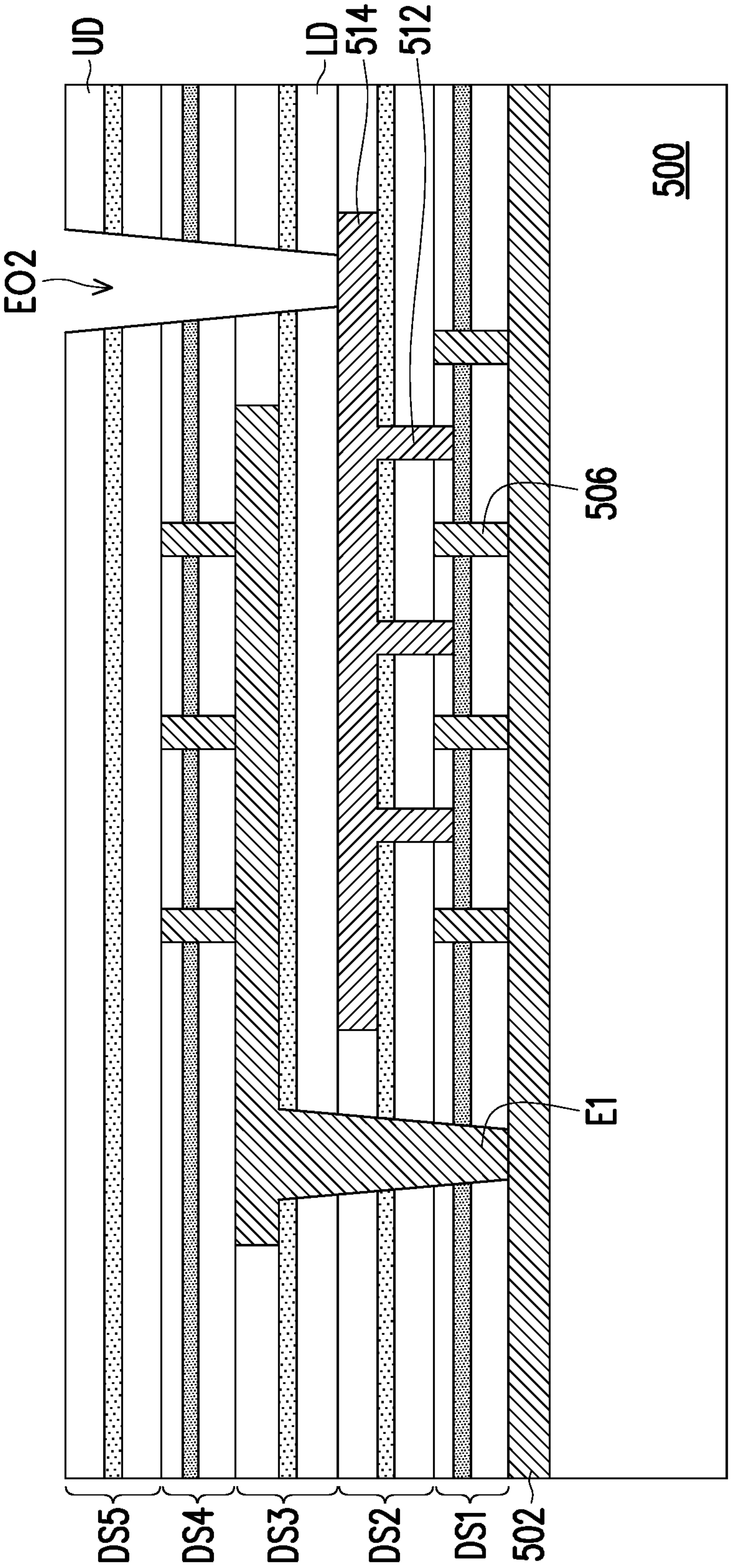
Figure 5M:
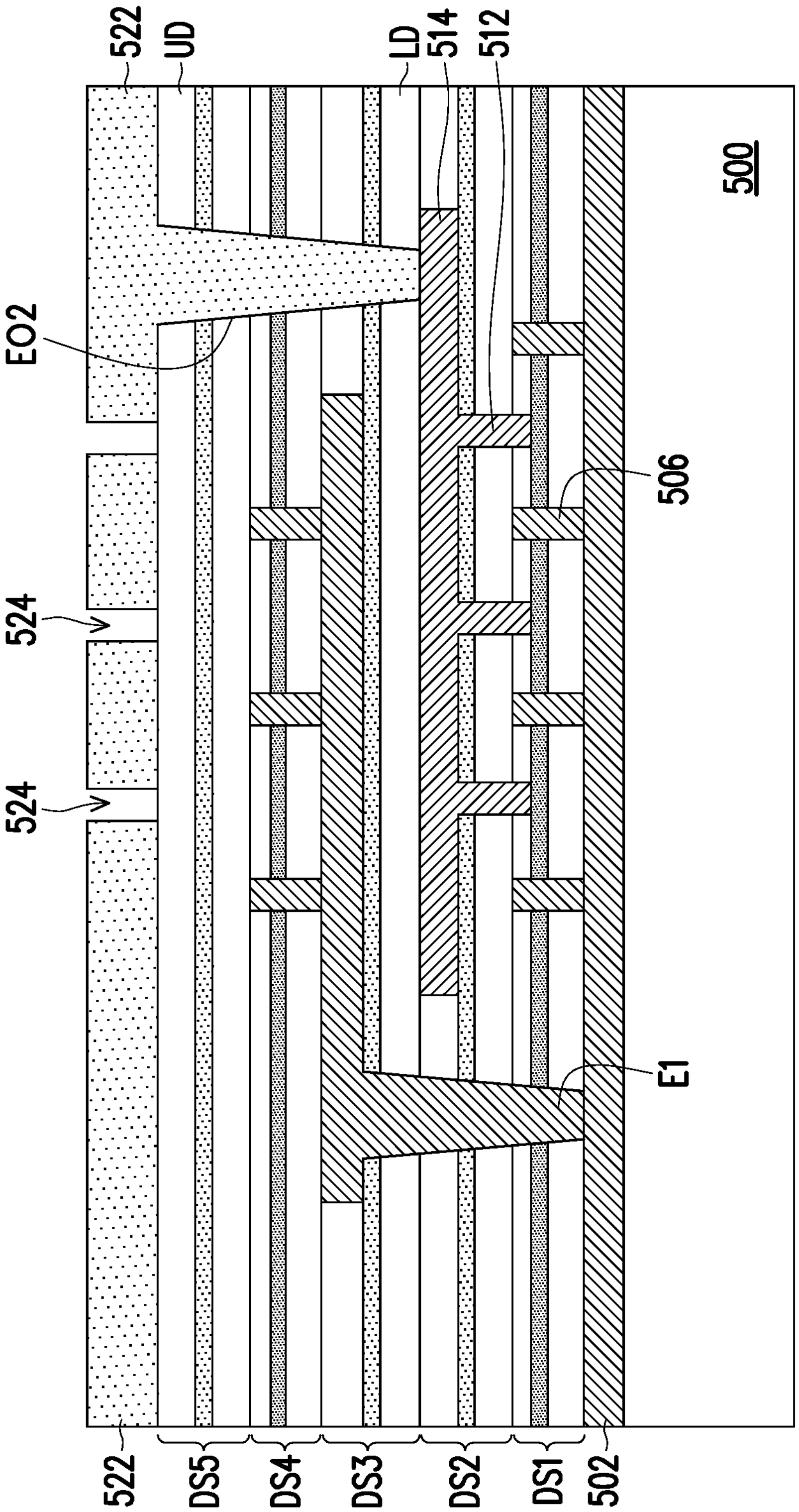
Figure 5N:
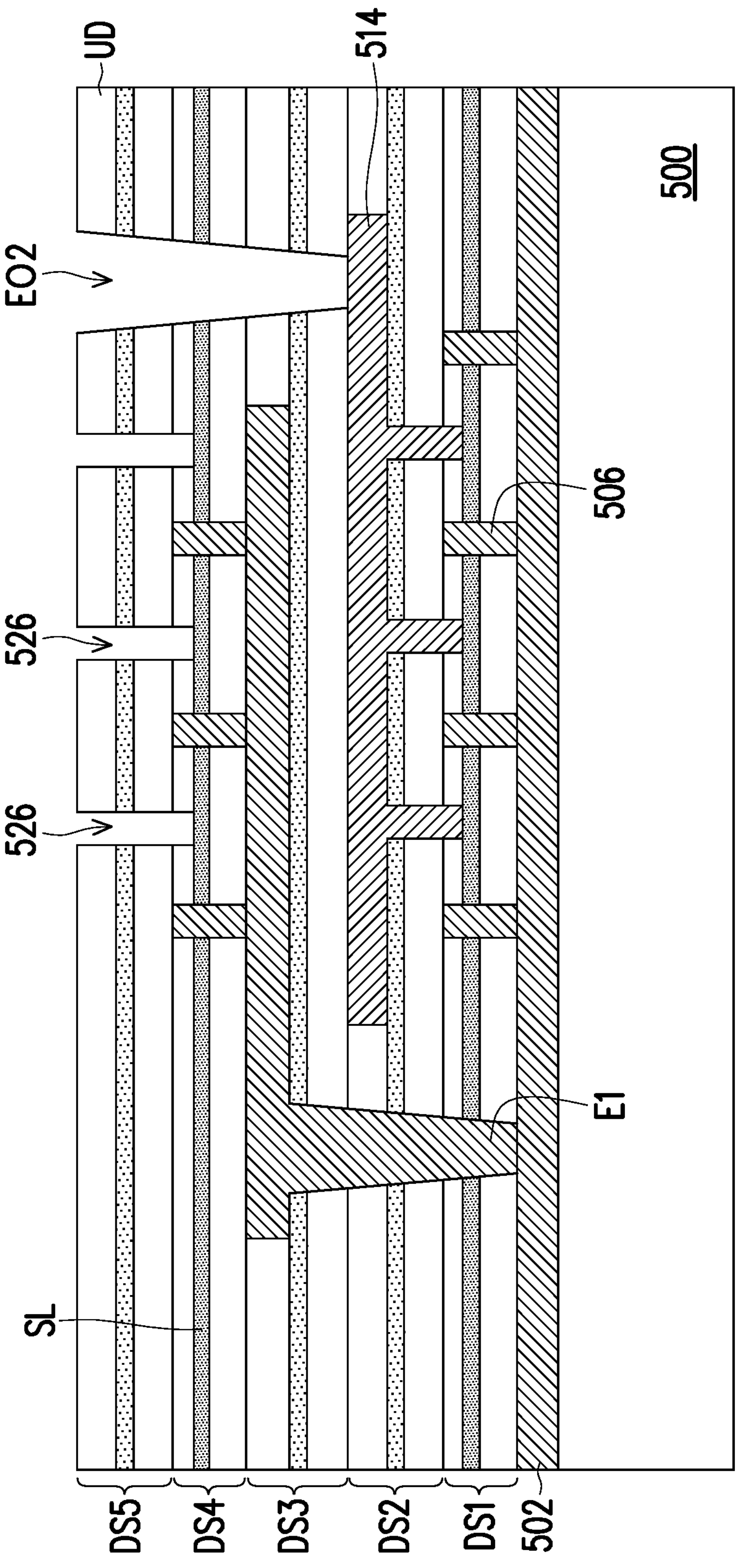
Figure 50:
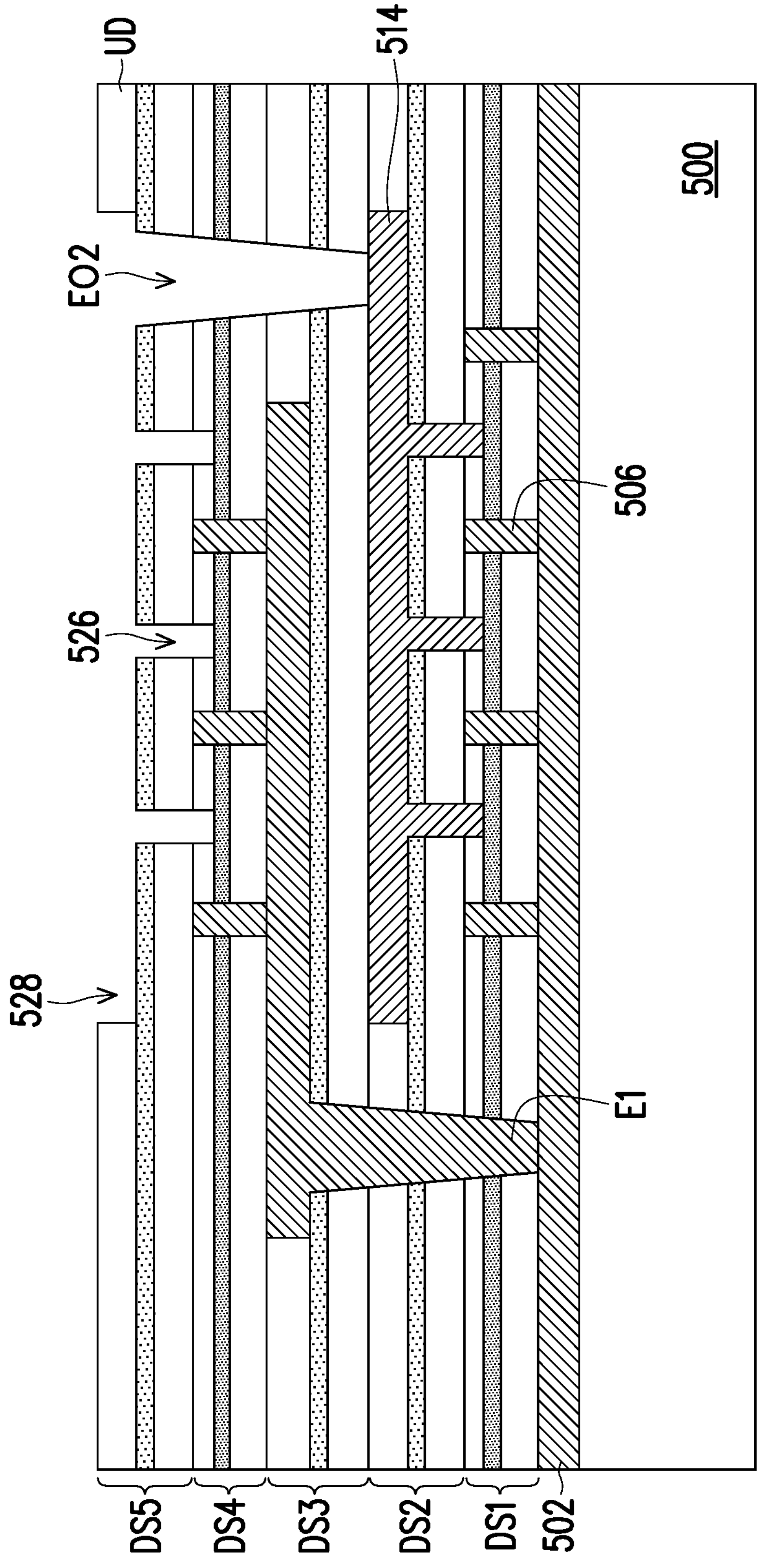
Figure 5P:
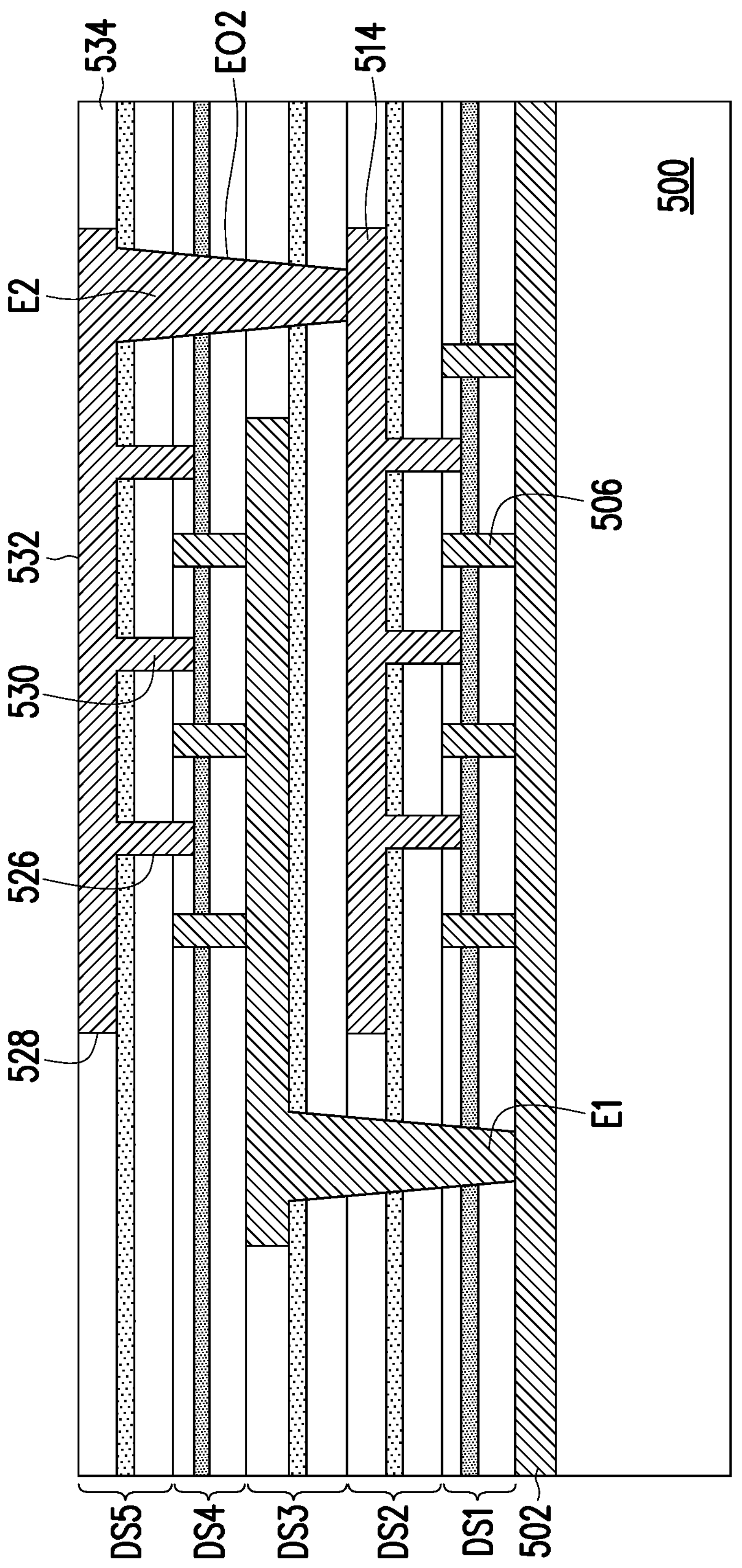
Figure 5Q:
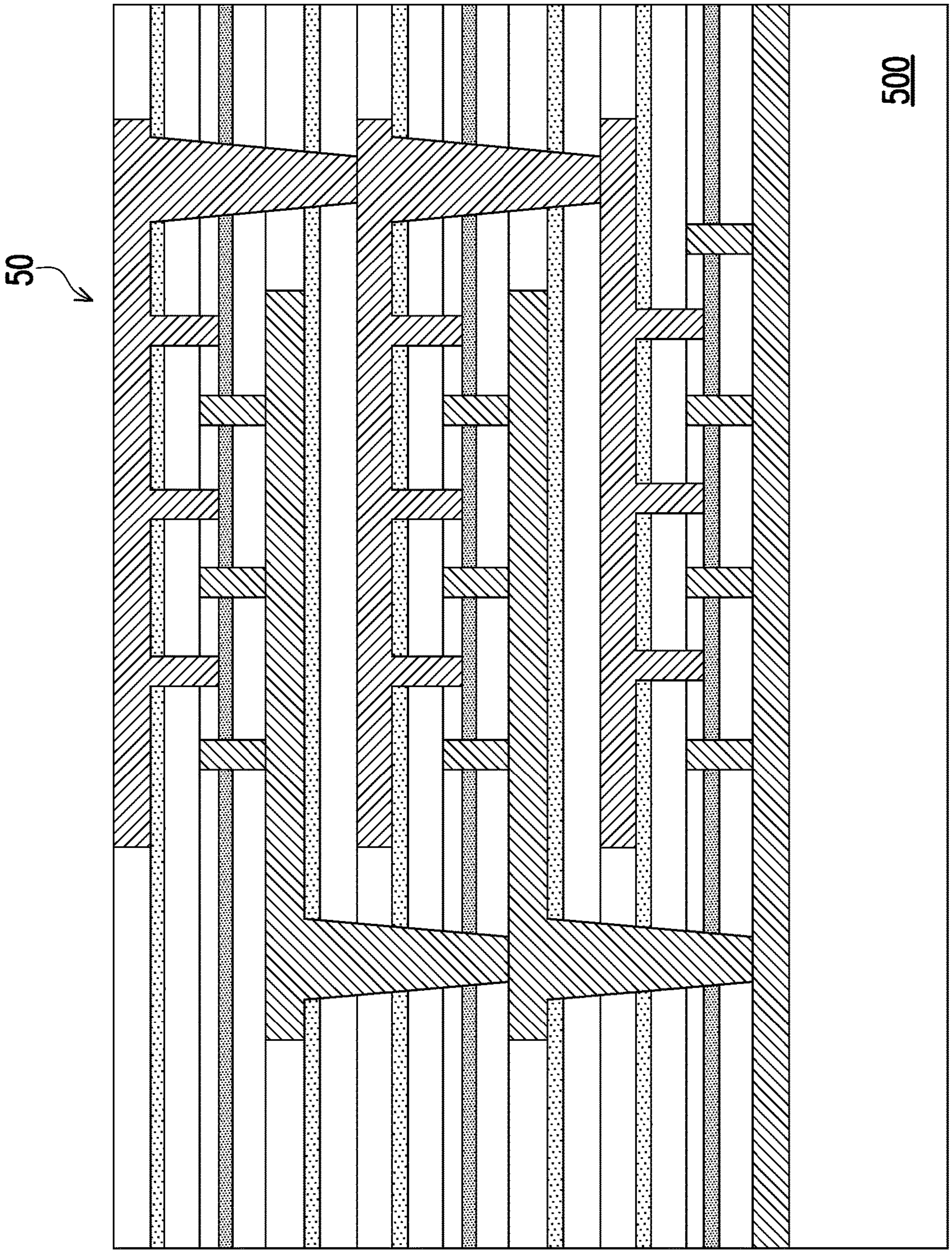
Figure 5R:
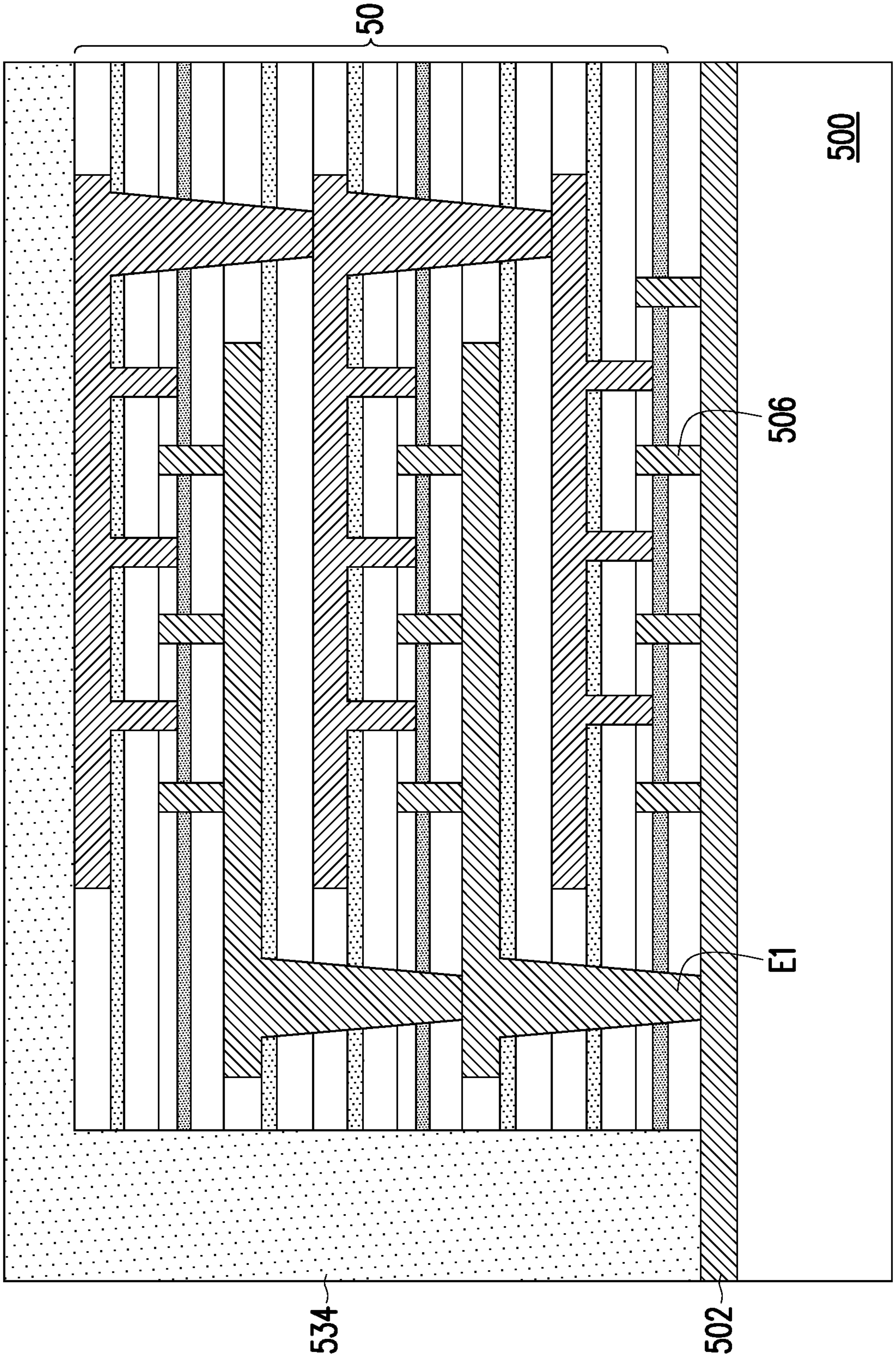
Figure 5S:
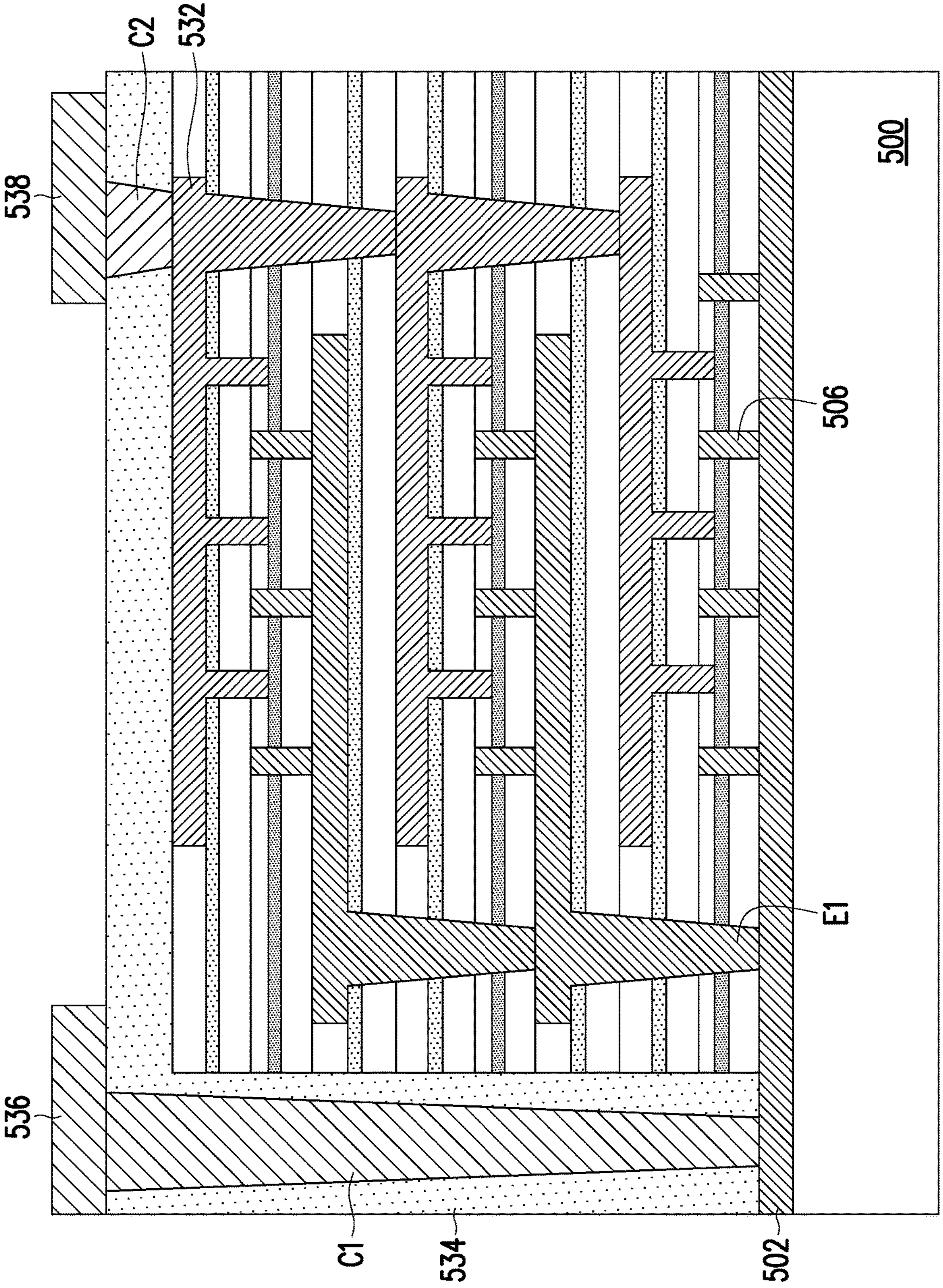

FIG. 5A to FIG. 5S are schematic cross-sectional views of a manufacturing process of a 3D capacitance structure according to a third embodiment of the disclosure. Please refer to FIG. 5A. The manufacturing method of the embodiment may first form a first lower electrode plate 502 on a substrate 500 using a manner such as electroplating (step (a)), and then form a first dielectric stack DS1 on the first lower electrode plate 502 (step (b)). The first dielectric stack DS1 includes a stack of a lower dielectric layer LD, an etching stop layer SL, and an upper dielectric layer UD. Then, multiple extended portion openings 504 may be formed in the first dielectric stack DS1 using a photolithographic etching process. Since there is an etching selectivity ratio between the etching stop layer SL and the upper dielectric layer UD and the lower dielectric layer LD in the first dielectric stack DS1, the etching process of forming the extended portion openings 504 use different etching gases to etch different materials.

After that, please refer to FIG. 5B. The extended portion opening 504 is filled with a conductor material M1 using a manner such as electroplating to form multiple first lower electrode extended portions 506 in the first dielectric stack DS1 (step (c)). The first lower electrode extended portion 506 passes upward from the first lower electrode plate 502 through the etching stop layer SL to the upper dielectric layer UD. In an embodiment, the extending direction of the first lower electrode extended portions 506 is perpendicular to the surface direction of the substrate 500.

Next, please refer to FIG. 5C. A planarization process may be first performed using a manner such as chemical mechanical polishing (CMP), the first lower electrode extended portion 506 is kept, and a second dielectric stack DS2 is then formed (step (d)). The structure of the second dielectric stack DS2 is the same as the first dielectric stack DS1. However, the thickness and the material of each layer of the second dielectric stack DS2 may be adjusted according to requirements and are not limited to being exactly the same as the first dielectric stack DS1.

Then, please refer to FIG. 5D. Multiple extended portion openings 508 may be formed in the second dielectric stack DS2 using a photolithographic etching process until the etching stop layer SL of the first dielectric stack DS1 is exposed as predetermined formation positions of upper electrode extended portions.

Next, please refer to FIG. 5E. An upper electrode plate trench 510 may be formed in the upper dielectric layer UD of the second dielectric stack DS2 using another photolithographic etching process. The upper electrode plate trench 510 and the extended portion opening 508 form a dual damascene opening.

Subsequently, please refer to FIG. 5F. The upper electrode plate trench 510 and the extended portion opening 508 are filled with a conductor material M2 using a manner such as electroplating to form multiple first upper electrode extended portions 512 in the second dielectric stack DS2 (step (e)) and form a first upper electrode plate 514 in the upper dielectric layer UD of the second dielectric stack DS2 (step (f)). Since the embodiment adopts a dual damascene process, the connected first upper electrode plate 514 and first upper electrode extended portions 512 may be simultaneously formed. However, the disclosure is not limited thereto. In another embodiment, the first upper electrode extended portions 512 may be first formed, and the first upper electrode plate 514 is then formed. The first upper electrode extended portion 512 passes through the etching stop layer SL of the second dielectric stack DS2 to extend to the etching stop layer SL of the first dielectric stack DS1. In other words, the size (for example, the height) of the first upper electrode extended portion 512 may be precisely controlled through the etching stop layer SL. In an embodiment, the extending direction of the first upper electrode extended portions 512 is perpendicular to the surface direction of the substrate 500. In an embodiment, the first lower electrode extended portions 506 and the first upper electrode extended portions 512 are strip structures staggered along the x direction (similar to the structure of FIG. 2). In another embodiment, the first lower electrode extended portions 506 and the first upper electrode extended portions 512 are columnar structures staggered along the x direction and the y direction (similar to the structure of FIG. 3).

Next, please refer to FIG. 5G. A planarization process such as a manner of CMP may be first performed, the first upper electrode extended portion 512 and the first upper electrode plate 514 are kept, and the third dielectric stack DS3 is then formed (step (g)). The structure of the third dielectric stack DS3 is the same as the first dielectric stack DS1. However, the thickness and the material of each layer of the third dielectric stack DS3 may be adjusted according to requirements and are not limited to being exactly the same as the first dielectric stack DS1.

Then, please refer to FIG. 5H. A first contact opening EO1 passing through the third dielectric stack DS3, the second dielectric stack DS2, and the first dielectric stack DS1 may be formed using a photolithographic etching process until the first electrode lower plate 502 is exposed (step (h)).

Next, please refer to FIG. 5I. A lower electrode plate trench 516 is formed in the upper dielectric layer UD of the third dielectric stack DS3, and the lower electrode plate trench 516 and the first contact opening EO1 form a first dual damascene opening (step (i)). Furthermore, in the embodiment, in the step of forming the lower electrode plate trench 516, the etching stop layer SL of the third dielectric stack DS3 may be used as a stop layer.

Then, please refer to FIG. 5J. A conductor material may be formed in the lower electrode plate trench 516 and the first contact opening EO1 (the first dual damascene opening) using electroplating to simultaneously form the first electrode contact E1 and the second lower electrode plate 518 (step (j)). In an example, the extending direction of the first electrode contact E1 is perpendicular to the surface direction of the first lower electrode plate 502.

Next, please refer to FIG. 5K. The steps from forming the first dielectric stack DS1 until forming the second dielectric stack DS2 are repeated to form a fourth dielectric stack DS4, multiple second lower electrode extended portions 520, and a fifth dielectric stack DS5 (step (k)).

Then, please refer to FIG. 5L, a second contact opening EO2 passing through the fifth dielectric stack DS5, the fourth dielectric stack DS4, and the third dielectric stack DS3 is formed until the first upper electrode plate 514 is exposed (step (1)).

Then, please refer to FIG. 5M, a mask layer 522 may be first formed on the fifth dielectric stack DS5 to fill the second contact opening EO2, wherein the mask layer 522 is, for example, spin-on-carbon (SOC) or photoresist. Then, multiple mask openings 524 may be formed in the mask layer 522 using a photolithography process as predetermined formation positions of upper electrode extended portions.

Next, please refer to FIG. 5N. The fifth dielectric stack DS5 exposed from the mask opening 524 is etched to be removed using the mask layer 522 of FIG. 5M as an etching mask until the etching stop layer SL of the fourth dielectric stack DS4 is exposed to form multiple extended portion openings 526 (step (m)). Then, the mask layer 522 of FIG. 5M is removed.

Then, please refer to FIG. 5O. An upper electrode plate trench 528 may be formed in the upper dielectric layer UD of the fifth dielectric stack DS5 using a photolithography process (step (n)). The upper electrode plate trench 528, the extended portion openings 526, and the second contact opening EO2 form a second dual damascene opening.

Next, please refer to FIG. 5P. A conductor material may be formed in the upper electrode plate trench 528, the extended portion opening 526, and the second contact opening EO2 (the second dual damascene opening) using electroplating to simultaneously form the second electrode contact E2, multiple second upper electrode extended portions 530, and a second upper electrode plate 532 (step (o)). In an embodiment, the extending direction of the second electrode contact E2 is perpendicular to the surface direction of the first upper electrode plate 514.

Please refer to FIG. 5Q again. The steps of FIG. 5G to the steps of FIG. 5P are repeated at least once (step (p)) to form a 3D capacitance structure 50. The disclosure is not limited thereto. The number of repetitions of the foregoing steps may be increased according to requirements to form a 3D capacitance structure with a greater number of stacks.

Next, please refer to FIG. 5R. In order to connect circuits of the 3D capacitance structure 50 to external or other elements, an interconnection structure may be formed on the substrate 500. For example, a space reserved for a contact window next to the 3D capacitance structure 50 is first defined, and an insulation layer 534 covering the entire 3D capacitance structure 50 is then comprehensively formed.

Then, please refer to FIG. 5S. The first contact window C1 connected to the first lower electrode plate 502 and the second contact window C2 connected to the second upper electrode plate 532 are first formed in the insulation layer 534, and a first metal layer 536 connected to the first contact window C1 and a second metal layer 538 connected to the second contact window C2 are then formed on the insulation layer 534. However, the disclosure is not limited thereto. In another embodiment, the interconnection structure may include multiple first contact windows C1 and multiple second contact windows C2, and the arrangement positions thereof may be changed according to requirements.

In summary, in the disclosure, through stacking the sub-capacitance stack structures, and directly connecting the sub-capacitance stack structures with the electrode contacts, the close and overlapping 3D capacitance structures can be formed, thereby increasing the capacitance and enabling the multi-layer structure to be difficult to collapse. Moreover, the etching stop layer is disposed in the sub-capacitance stack structure, so the thickness of each layer can be controlled, thereby obtaining the most suitable stack, that is, obtaining the optimal upper limit configuration according to requirements.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A 3D capacitance structure, comprising:
a substrate;
a plurality of sub-capacitance stack structures, disposed on the substrate, wherein each of the sub-capacitance stack structures comprises:
a dielectric stack, comprising a stack of a lower dielectric layer, a lower etching stop layer, an intermediate dielectric layer, an upper etching stop layer, and an upper dielectric layer;
a lower electrode structure, comprising a lower electrode plate disposed in the lower dielectric layer and a plurality of lower electrode extended portions passing upward from the lower electrode plate through the lower etching stop layer to the intermediate dielectric layer; and
an upper electrode structure, comprising an upper electrode plate disposed in the upper dielectric layer and a plurality of upper electrode extended portions passing downward from the upper electrode plate through the upper etching stop layer and the intermediate dielectric layer to the lower etching stop layer;
a plurality of first electrode contacts, respectively connecting the lower electrode plates of two adjacent layers in the sub-capacitance stack structures; and
a plurality of second electrode contacts, respectively connecting the upper electrode plates of two adjacent layers in the sub-capacitance stack structures.

2. The 3D capacitance structure according to claim 1, wherein extending directions of the lower electrode extended portions and the upper electrode extended portions are perpendicular to a surface direction of the substrate.

3. The 3D capacitance structure according to claim 1, wherein surface directions of the lower electrode plate and the upper electrode plate are perpendicular to extending directions of the first electrode contacts and the second electrode contacts.

4. The 3D capacitance structure according to claim 1, wherein the lower electrode extended portions and the upper electrode extended portions are strip structures staggered along an x direction.

5. The 3D capacitance structure according to claim 1, wherein the lower electrode extended portions and the upper electrode extended portions are columnar structures staggered along an x direction and a y direction.

6. The 3D capacitance structure according to claim 1, wherein the lower dielectric layer, the intermediate dielectric layer, and the upper dielectric layer comprise silicon oxide, and the lower etching stop layer and the upper etching stop layer comprise silicon nitride.

7. A manufacturing method of a 3D capacitance structure, comprising:
(a) forming a first lower electrode plate on a substrate;
(b) forming a first dielectric stack on the first lower electrode plate, wherein the first dielectric stack comprises a stack of a lower dielectric layer, an etching stop layer, and an upper dielectric layer;
(c) forming a plurality of first lower electrode extended portions in the first dielectric stack, wherein the first lower electrode extended portions pass upward from the first lower electrode plate through the etching stop layer to the upper dielectric layer;
(d) forming a second dielectric stack, wherein a structure of the second dielectric stack is the same as the first dielectric stack;

(e) forming a plurality of first upper electrode extended portions in the second dielectric stack, wherein the first upper electrode extended portions pass through an etching stop layer of the second dielectric stack to extend to the etching stop layer of the first dielectric stack;

(f) forming a first upper electrode plate in the upper dielectric layer of the second dielectric stack, wherein the first upper electrode plate is connected to the first upper electrode extended portions;

(g) forming a third dielectric stack, wherein a structure of the third dielectric stack is the same as the first dielectric stack;

(h) forming a first contact opening passing through the third dielectric stack, the second dielectric stack, and the first dielectric stack until the first lower electrode plate is exposed;

(i) forming a lower electrode plate trench in an upper dielectric layer of the third dielectric stack, wherein the lower electrode plate trench and the first contact opening form a first dual damascene opening;

(j) forming a conductor material in the first dual damascene opening to simultaneously form a first electrode contact and a second lower electrode plate;

(k) repeating (b) to (d) to form a fourth dielectric stack, a plurality of second lower electrode extended portions, and a fifth dielectric stack;

(l) forming a second contact opening passing through the fifth dielectric stack, the fourth dielectric stack, and the third dielectric stack until the first upper electrode plate is exposed;

(m) forming a plurality of extended portion openings passing through the fifth dielectric stack and an upper dielectric layer of the fourth dielectric stack until an etching stop layer of the fourth dielectric stack is exposed;

(n) forming an upper electrode plate trench in an upper dielectric layer of the fifth dielectric stack, wherein the upper electrode plate trench, the extended portion openings, and the second contact opening form a second dual damascene opening;

(o) forming a conductor material in the second dual damascene opening to simultaneously form a second electrode contact, a plurality of second upper electrode extended portions, and a second upper electrode plate; and (p) repeating (g) to (o) at least once.

8. The manufacturing method of the 3D capacitance structure according to claim 7, wherein extending directions of the first lower electrode extended portions and the first upper electrode extended portions are perpendicular to a surface direction of the substrate.

9. The manufacturing method of the 3D capacitance structure according to claim 7, wherein surface directions of the first lower electrode plate and the first upper electrode plate are perpendicular to extending directions of the first electrode contact and the second electrode contact.

10. The manufacturing method of the 3D capacitance structure according to claim 7, wherein the first lower electrode extended portions and the first upper electrode extended portions are strip structures staggered along an x direction.

11. The manufacturing method of the 3D capacitance structure according to claim 7, wherein the first lower electrode extended portions and the first upper electrode extended portions are columnar structures staggered along an x direction and a y direction.

12. The manufacturing method of the 3D capacitance structure according to claim 7, wherein in forming the lower electrode plate trench, an etching stop layer of the third dielectric stack is used as a stop layer.

* * * * *